United States Patent
Yang et al.

(10) Patent No.: US 11,322,871 B2
(45) Date of Patent: May 3, 2022

(54) ELECTRICAL CONNECTOR ASSEMBLY HAVING FLOATING HEAT SINK IN RESILIENT MANNER

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Chun-Chieh Yang, New Taipei (TW); Wei-Chih Lin, New Taipei (TW); Hsiu-Yuan Hsu, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 0 days.

(21) Appl. No.: 17/019,386

(22) Filed: Sep. 14, 2020

(65) Prior Publication Data

US 2021/0083411 A1    Mar. 18, 2021

(30) Foreign Application Priority Data

Sep. 12, 2019 (CN) .......................... 201910863840.3

(51) Int. Cl.
*H01R 12/71* (2011.01)
*H05K 7/20* (2006.01)
(Continued)

(52) U.S. Cl.
CPC ..... *H01R 12/716* (2013.01); *H01R 13/62933* (2013.01); *H05K 7/2049* (2013.01);
(Continued)

(58) Field of Classification Search
CPC ............ H01R 12/716; H01R 13/62933; H01R 13/62; H01R 13/629; H01R 12/7076;
(Continued)

(56) References Cited

U.S. PATENT DOCUMENTS

| | | | |
|---|---|---|---|
| 9,331,424 B2 | 5/2016 | Yuan et al. | |
| 9,395,409 B2 * | 7/2016 | Lin | .................... G01R 31/2863 |
| 2007/0049066 A1 | 3/2007 | Ju | |

FOREIGN PATENT DOCUMENTS

| | | |
|---|---|---|
| CN | 1805669 A | 7/2006 |
| CN | 1816264 A | 8/2006 |

(Continued)

*Primary Examiner* — Abdullah A Riyami
*Assistant Examiner* — Justin M Kratt
(74) *Attorney, Agent, or Firm* — Ming Chieh Chang; Wei Te Chung (57) ABSTRACT

An electrical connector assembly includes a seat unit and a cover unit. The seat unit defines a receiving cavity for receiving the CPU. The cover unit is pivotably mounted upon one end of the seat unit. The cover unit includes a first cover and a second cover surrounding the first cover. The first cover includes a first frame equipped with therein a floating heat sink which is located above and aligned with the receiving cavity. The heat sink forms a pair of side extensions sandwiched between a pair of pressing blocks and the first frame in a vertical direction and essentially downwardly pressed by the pair of pressing blocks of the first cover in a resilient manner. Resilient mechanism is provided between the pressing block and the heat sink to result in a downward force constantly urge the heat sink downwardly against the first frame.

19 Claims, 12 Drawing Sheets

(51) Int. Cl.
*H01R 13/629* (2006.01)
*H01R 13/62* (2006.01)
*H01L 23/40* (2006.01)
*H01L 23/367* (2006.01)
*G06F 1/20* (2006.01)
*H01R 12/70* (2011.01)
*H05K 1/02* (2006.01)
*H01R 13/533* (2006.01)
*H01R 13/502* (2006.01)

(52) U.S. Cl.
CPC .............. *G06F 1/20* (2013.01); *H01L 23/367* (2013.01); *H01L 23/40* (2013.01); *H01L 23/4006* (2013.01); *H01L 23/4093* (2013.01); *H01R 12/7076* (2013.01); *H01R 13/502* (2013.01); *H01R 13/533* (2013.01); *H01R 13/62* (2013.01); *H01R 13/629* (2013.01); *H05K 1/0203* (2013.01); *H05K 7/2039* (2013.01); *H05K 7/20445* (2013.01); *H05K 7/20518* (2013.01)

(58) Field of Classification Search
CPC .. H01R 13/502; H01R 13/533; H05K 7/2049; H05K 7/20445; H05K 7/2039–20518; H05K 1/0203; H01L 23/4006; H01L 23/367; H01L 23/40–4093; G06F 1/20
USPC .......... 361/709, 710; 439/73, 331, 485, 487
See application file for complete search history.

(56) References Cited

FOREIGN PATENT DOCUMENTS

| | | |
|---|---|---|
| CN | 201072828 Y | 6/2008 |
| CN | 201303186 Y | 9/2009 |
| CN | 202547825 U | 11/2012 |
| CN | 202929056 U | 5/2013 |
| CN | 203445305 U | 2/2014 |
| CN | 103808424 A | 5/2014 |
| CN | 109768400 A | 5/2019 |

* cited by examiner

ELECTRICAL CONNECTOR ASSEMBLY HAVING FLOATING HEAT SINK IN RESILIENT MANNER

BACKGROUND OF THE INVENTION

1. Field of the Invention

The present invention relates generally to an electrical connector assembly, and particularly to the electrical assembly connector adapted to receive a CPU (Central Processing Unit) and equipped with a floatable heat sink in a resilient manner.

2. Description of Related Arts

U.S. Pat. No. 9,395,409 discloses an electrical connector assembly adapted to be mated with a CPU and equipped with a floatable heat sink for compliance with the CPUs with different dimensions/thicknesses in the vertical direction. Anyhow, there is no proper resilient device to have the heat sink be constantly in an evenly tensioned manner, thus tending to have an unbalanced force distribution among the contacts of the electrical connector during closing the cover of the electrical connector assembly, which may damage the contacts of the connector.

Hence, it is desired to have an electrical connector assembly, for mating with a CPU, equipped with a controllable floating heat sink under resilient pressure.

SUMMARY OF THE INVENTION

To achieve the above object, an electrical connector assembly for connecting a CPU or electronic package with a printed circuit board (PCB), includes a seat unit and a cover unit. The seat unit defines a receiving cavity for receiving the CPU, and includes a plurality of contacts upwardly extending into the receiving cavity. The cover unit is pivotably mounted upon one end of the seat unit. The cover unit includes a first cover and a second cover surrounding the first cover. The first cover includes a first frame equipped with therein a floating heat sink which is located above and aligned with the receiving cavity. The heat sink forms a pair of side extensions sandwiched between a pair of pressing blocks and the first frame in a vertical direction and essentially downwardly pressed by that pair of pressing blocks of the first cover in a resilient manner. The second cover includes a second frame having one end pivotally mounted to the seat unit, a metallic top having thereof one end pivotally mounted to another end of the second frame, and a rotatable locking piece pivotally mounted to another end of the metallic top with a lock releasably engaged with the seat unit for retaining the CPU within the electrical connector assembly wherein the heat sink downwardly presses the CPU in a resilient/floating manner. Another feature of the invention is to provide the electrical connector assembly equipped with a temperature sensor in the heat sink for assuring the precise temperature of the heat sink for not damaging the CPU due to overheating.

Other advantages and novel features of the invention will become more apparent from the following detailed description of the present embodiment when taken in conjunction with the accompanying drawings.

DETAILED DESCRIPTION OF THE PREFERRED EMBODIMENT

Referring to FIGS. 1-11, an electrical connector assembly 1000 for receiving a CPU 2000 and mounting a PCB (not shown), includes a seat unit 100, a cover unit 200 pivotally secured to the seat unit 100 via a first pivot 300. The seat unit 100 includes a top face 101 with a receiving cavity 102 therein for receiving the CPU 2000, and a plurality of contacts (not shown) upwardly extending into the receiving cavity 102. The cover unit 200 includes a first cover 1 and a second cover 2 assembled with to the first cover 1. The first cover 1 includes a first frame 11, a floating heat sink 12, and a pair of pressing blocks 13 cooperating with the first frame 11 to sandwich the heat sink 12 therebetween along a vertical direction in a floatable and resilient manner. The heat sink 12 is essentially located above the receiving cavity 102. The first pivot 300 extends through the pivot hole 109 of the seat unit 100 and the pivot hole 209 of the second cover 2 for pivotally securing the cover unit 200 and the seat unit 100 together.

The first frame 11 is rectangular and includes front wall 111, the rear wall 112, the left wall 113 and the right wall 114 to commonly form the opening 115 thereamong. The left wall 113 and the right wall 114 form a plurality of securing holes 116. The front wall 111 as well as the rear wall 112, forms a slot 117 extending therethrough in a front-to-back direction.

Figure 1:
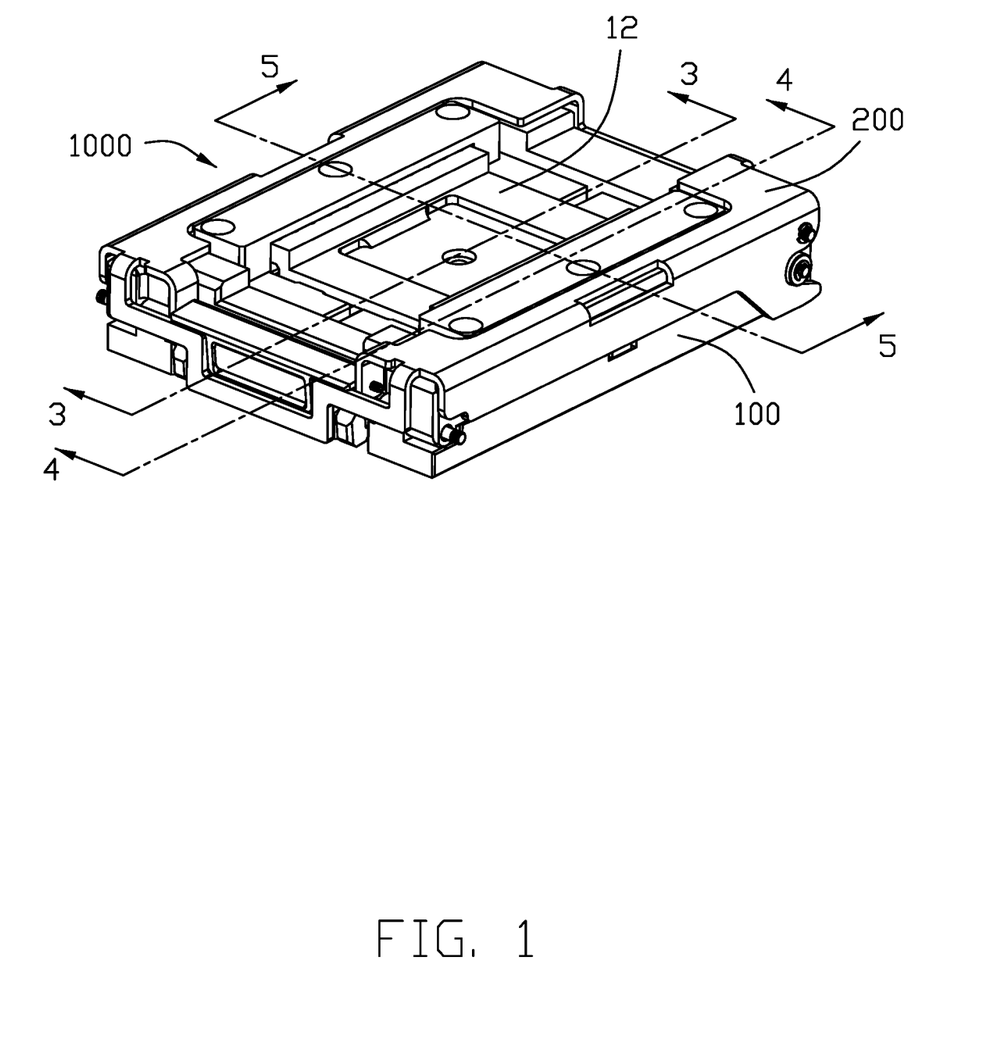
FIG. 1 is a perspective view of the electrical connector assembly of the present invention.
Figure 2:
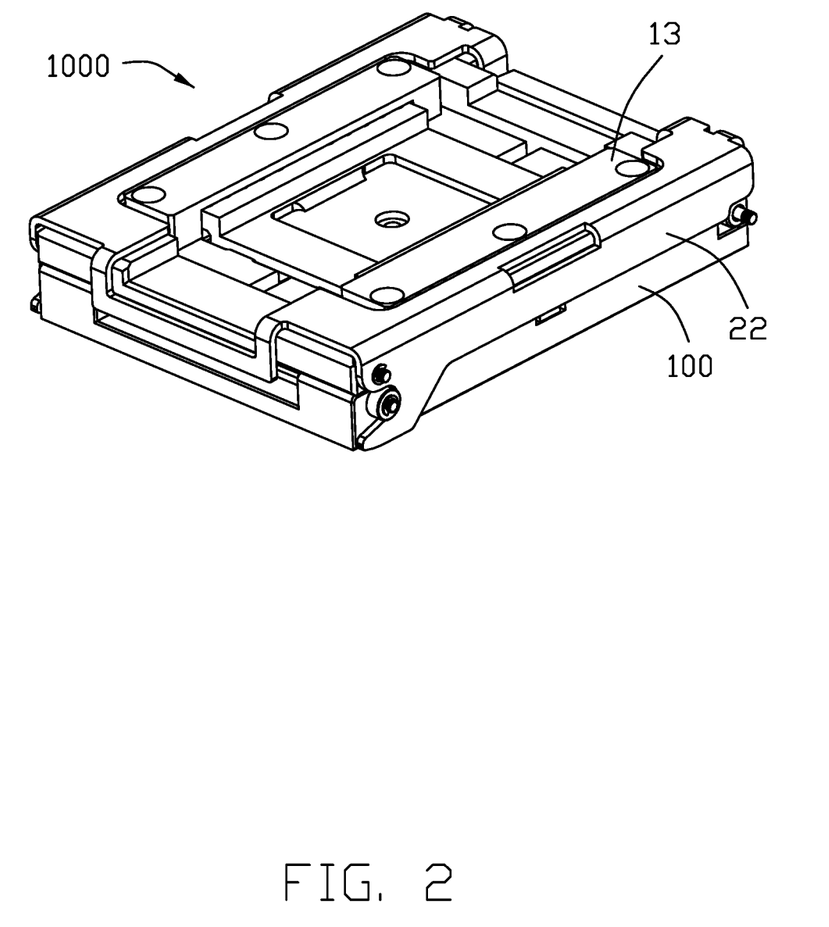
FIG. 2 is another perspective view of the electrical connector assembly of FIG. 1.
Figure 3:
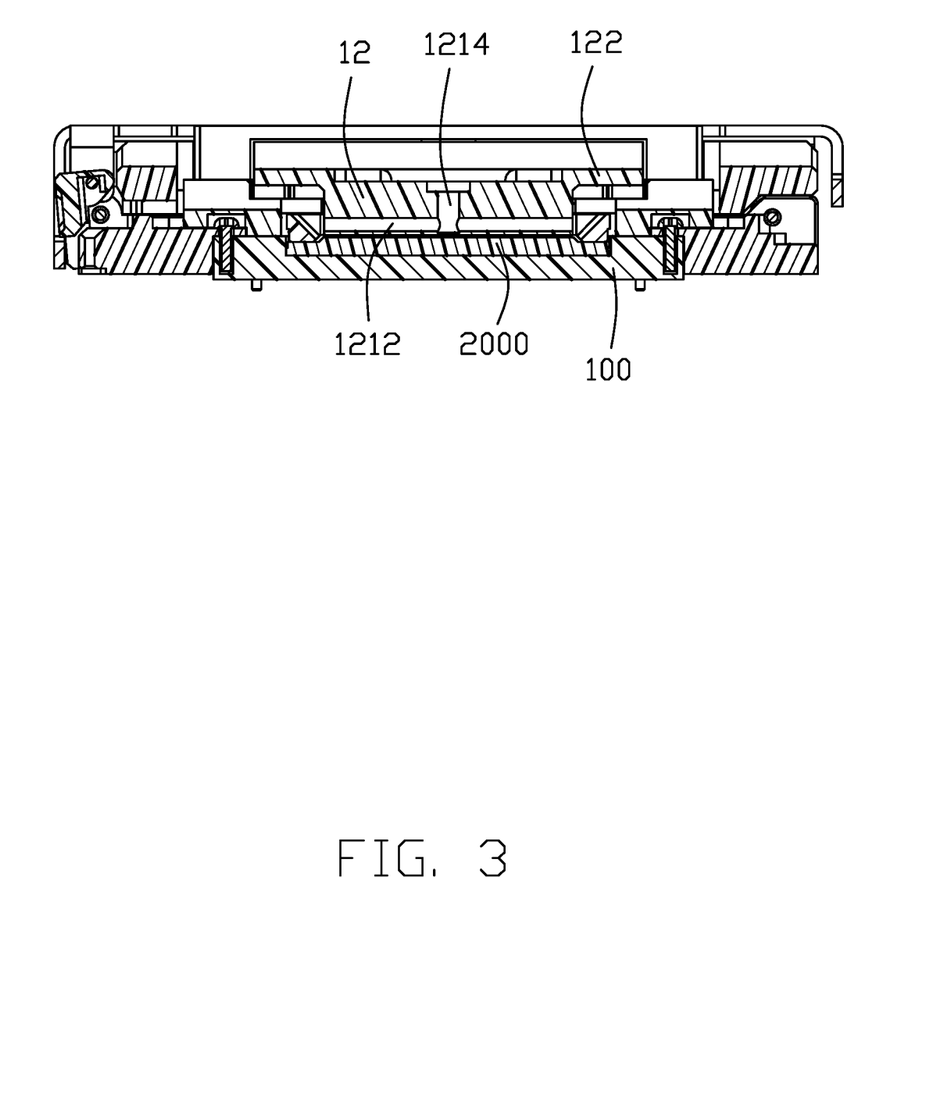
FIG. 3 is a cross-sectional view of the electrical connector assembly of FIG. 1 along line 3-3.
Figure 4:
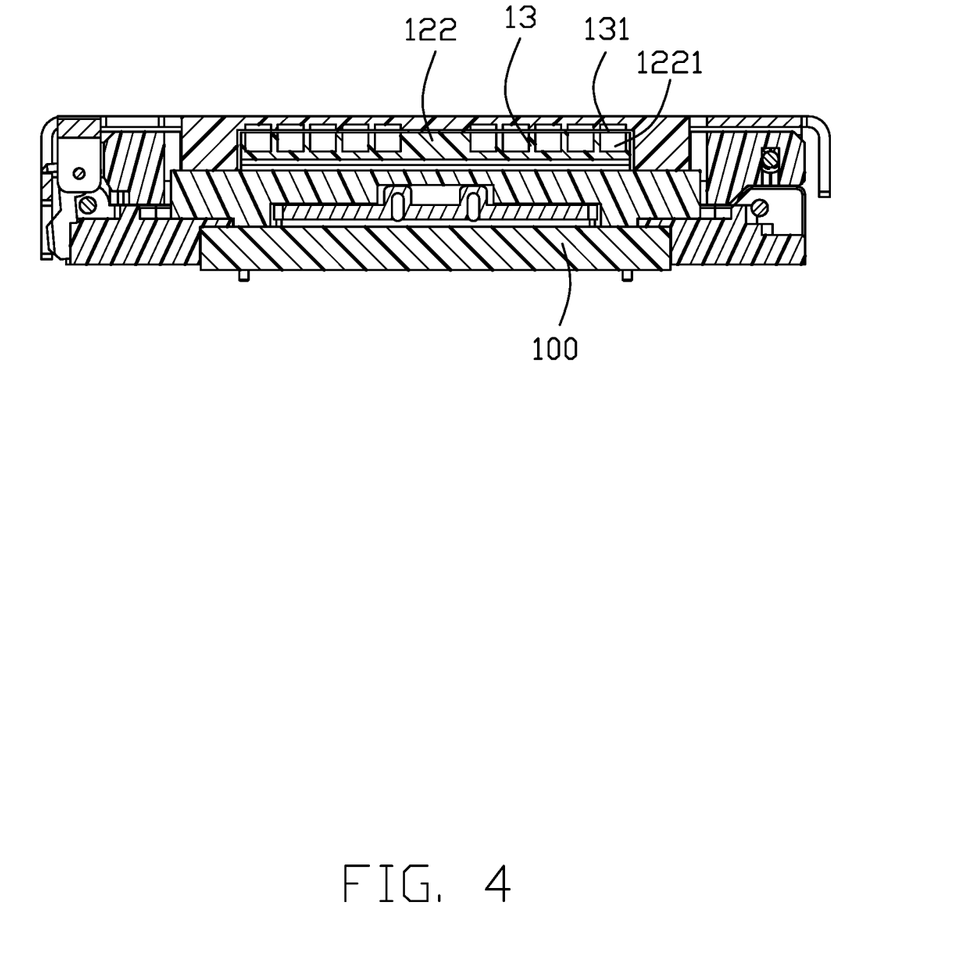
FIG. 4 is a cross-sectional view of the electrical connector assembly of FIG. 1 along line 4-4.
Figure 5:
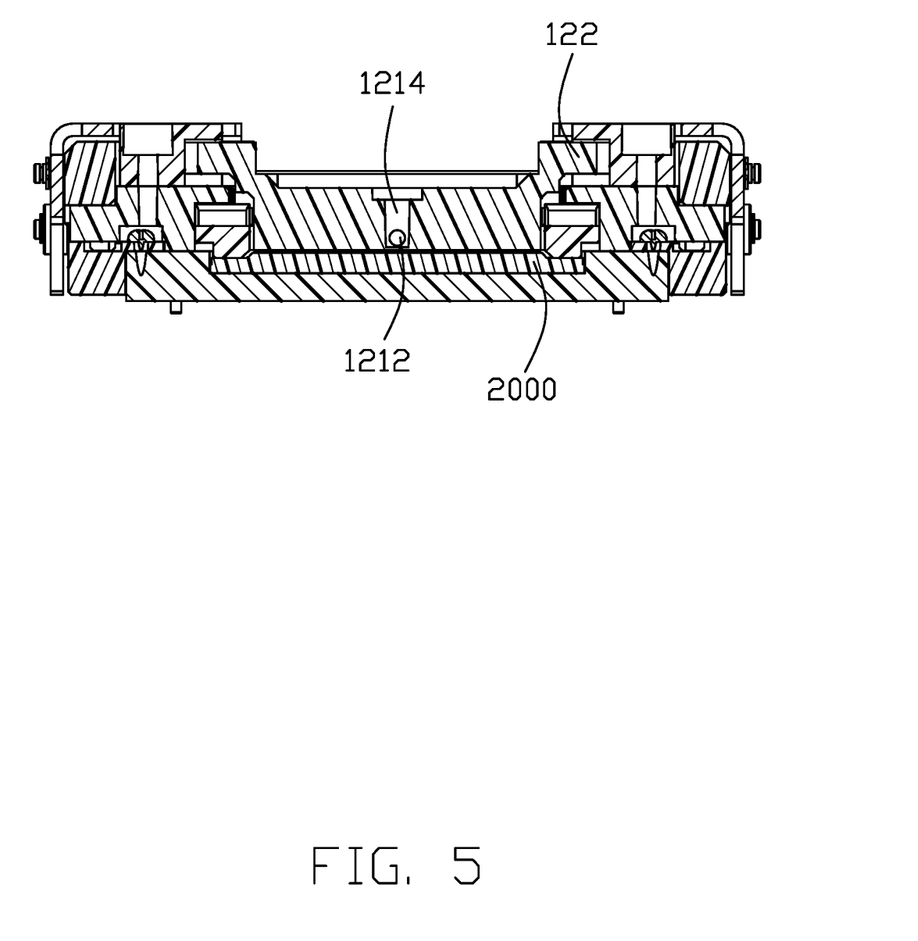
FIG. 5 is a cross-sectional view of the electrical connector assembly of FIG. 1 along line 5-5.
Figure 6:
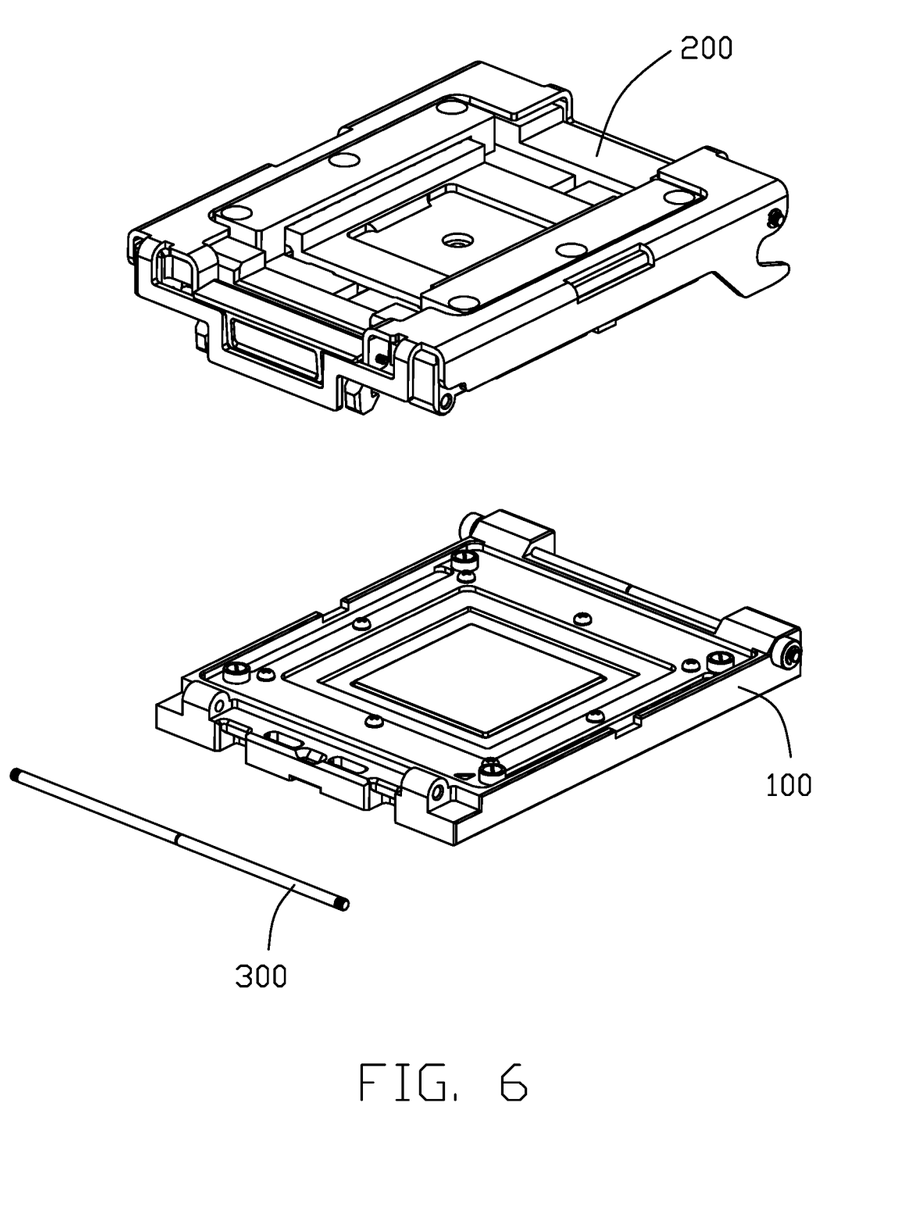
FIG. 6 is an exploded perspective view of the electrical connector assembly of FIG. 1.
Figure 7:
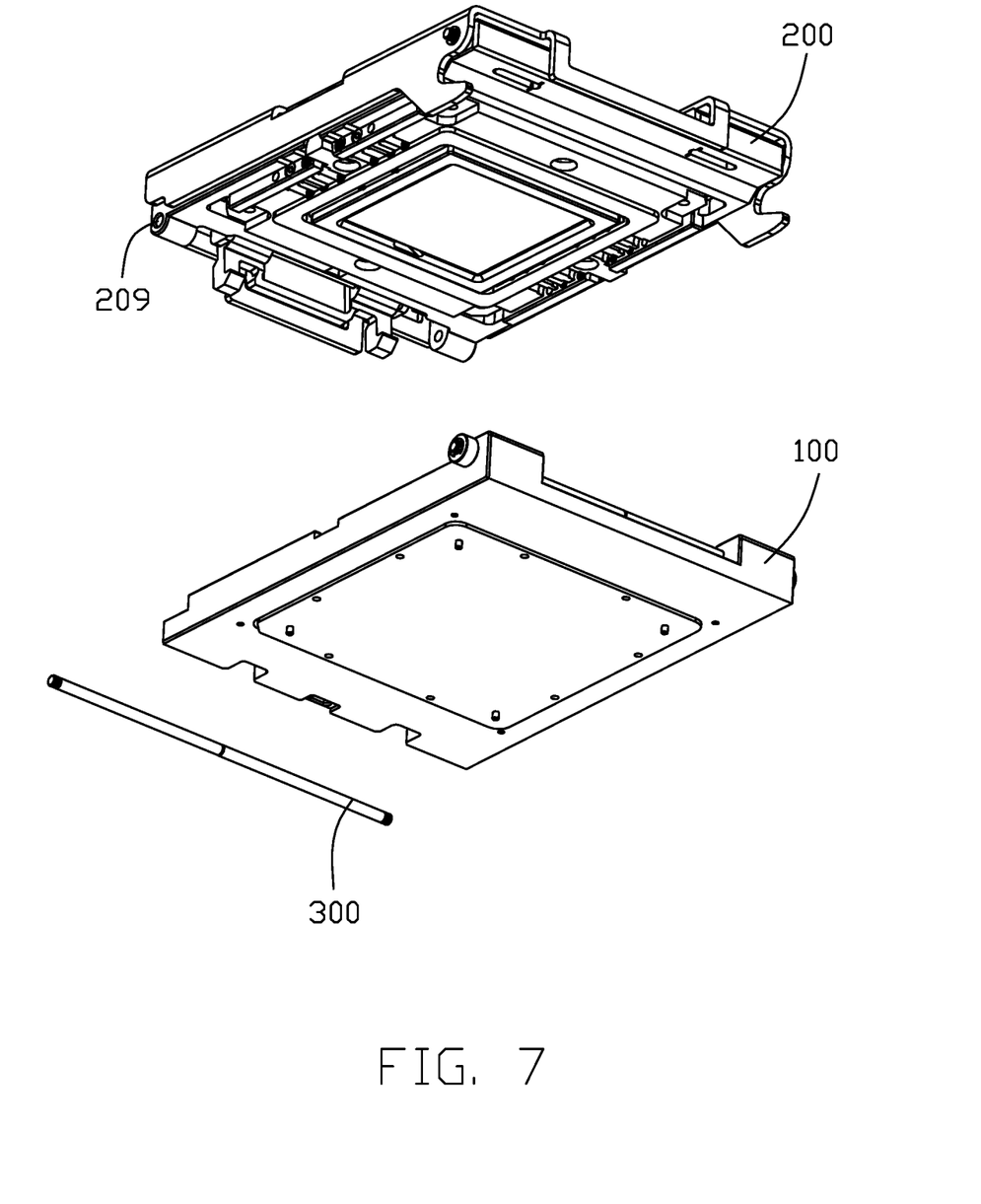
FIG. 7 is another exploded perspective view of the electrical connector assembly of FIG. 1.
Figure 8:
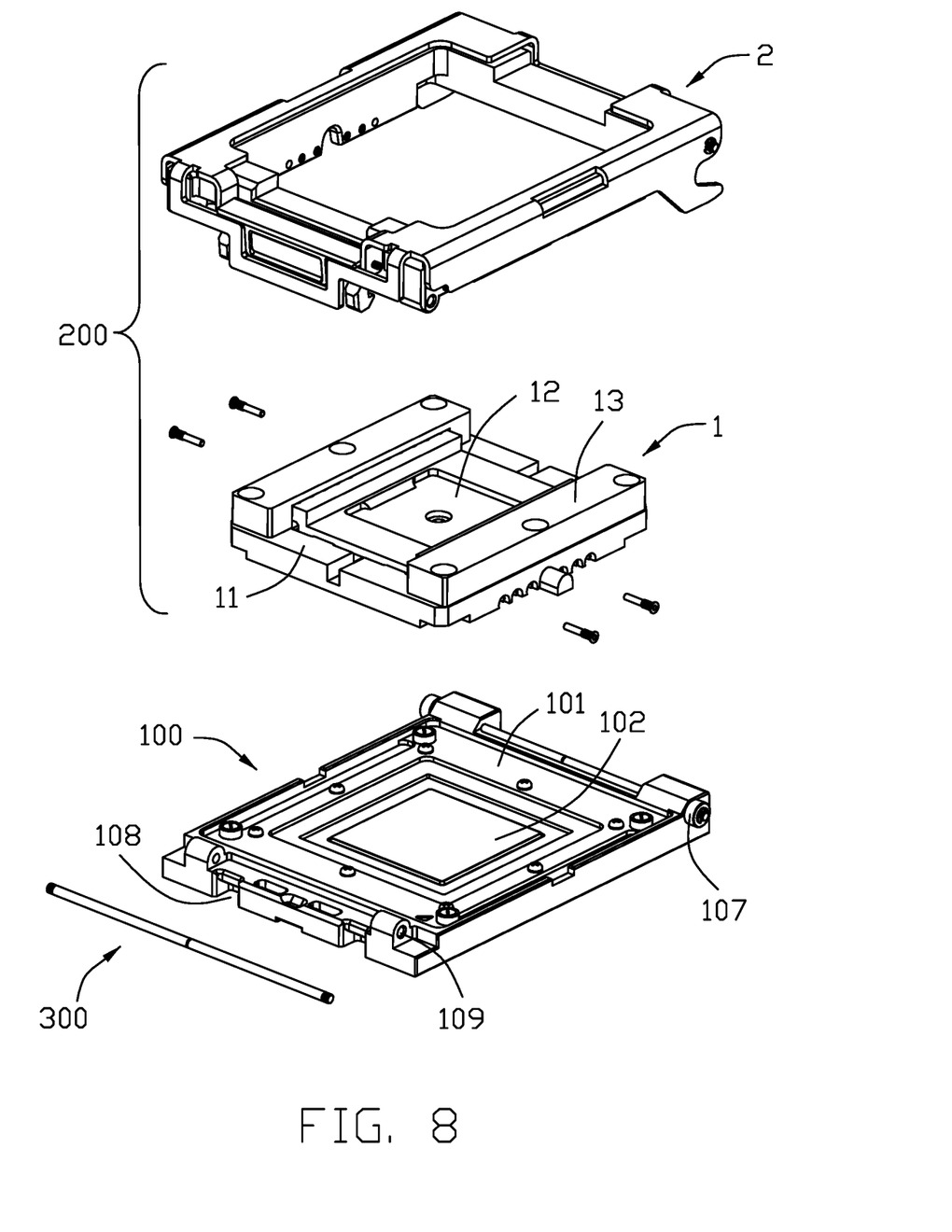
FIG. 8 is a further exploded perspective view of the electrical connector assembly of FIG. 7.
Figure 9:
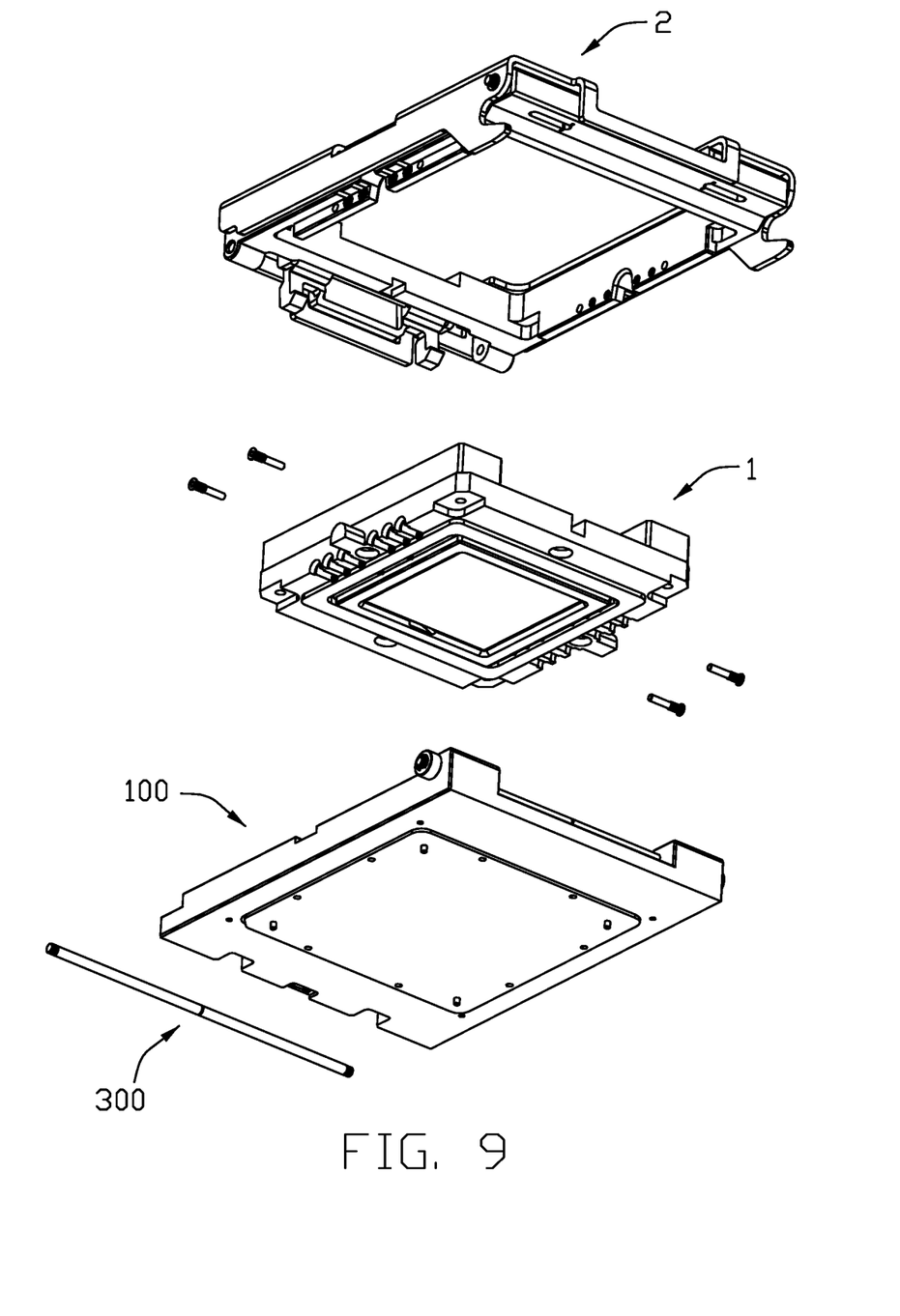
FIG. 9 is another exploded perspective view of the electrical connector assembly of FIG. 8.
Figure 10:
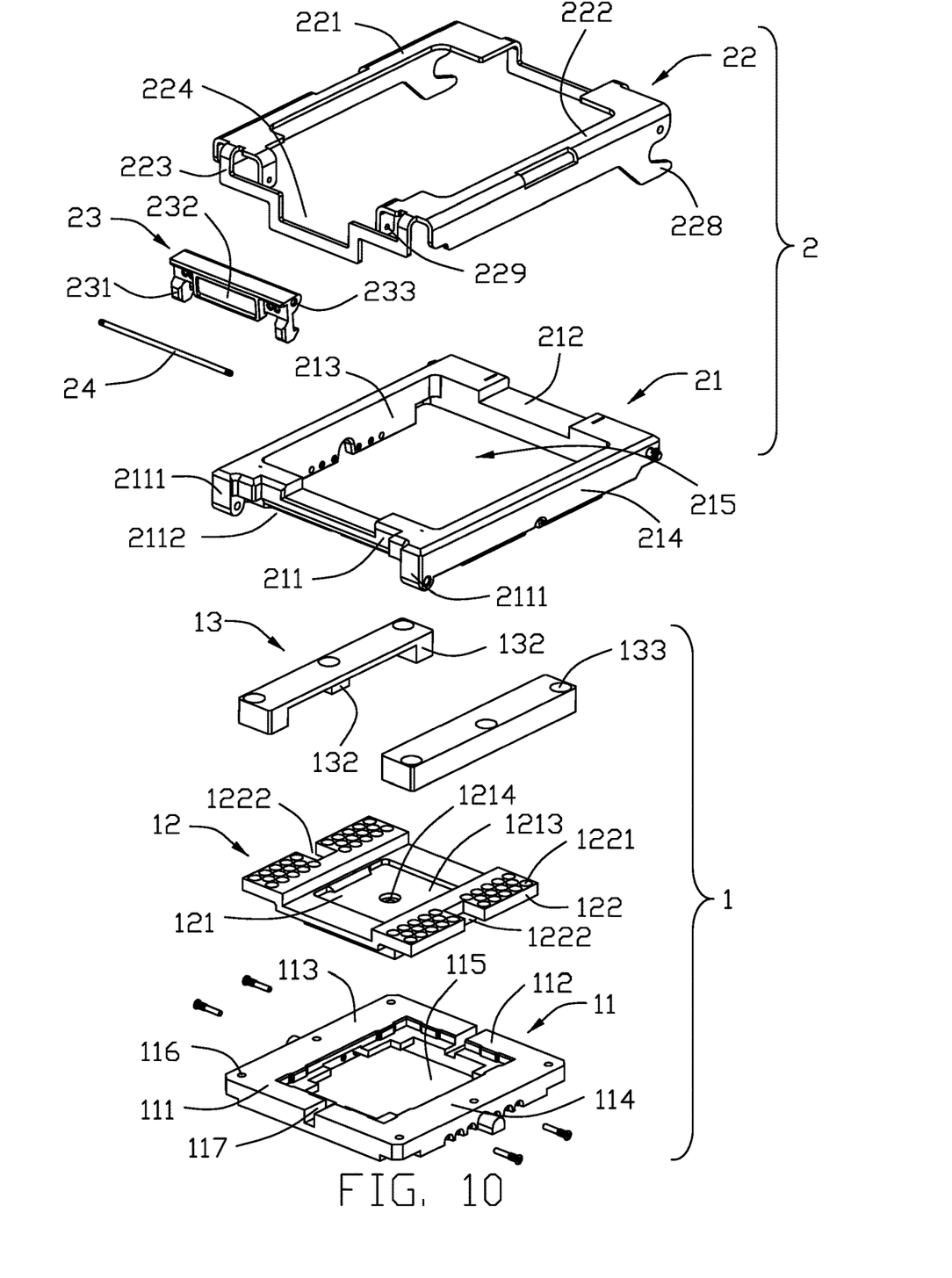
FIG. 10 is a further exploded perspective view of the cover unit of the electrical connector assembly of FIG. 8.
Figure 11:
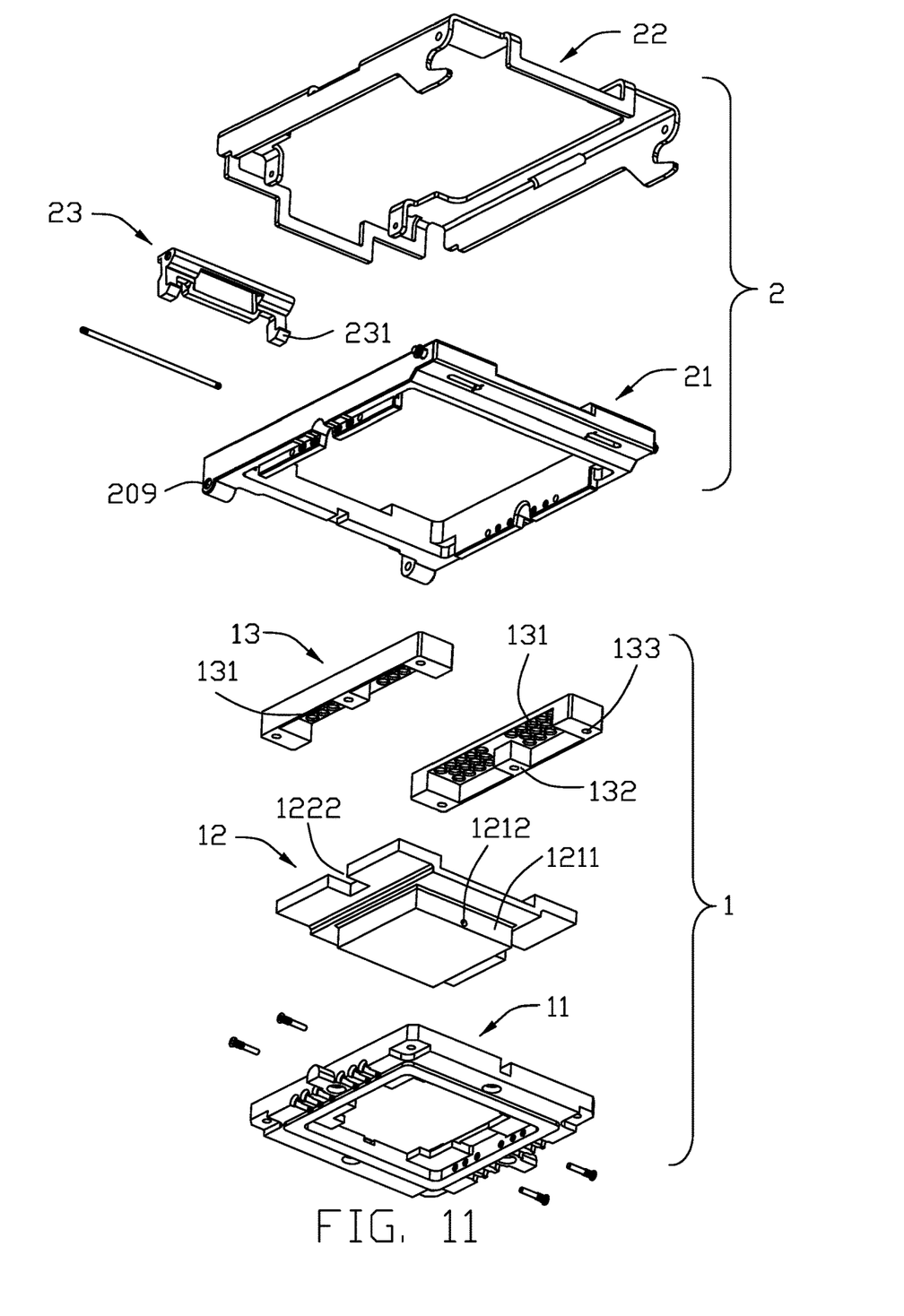
FIG. 11 is another exploded perspective view of the electrical connector assembly of FIG. 10.
Figure 11A:
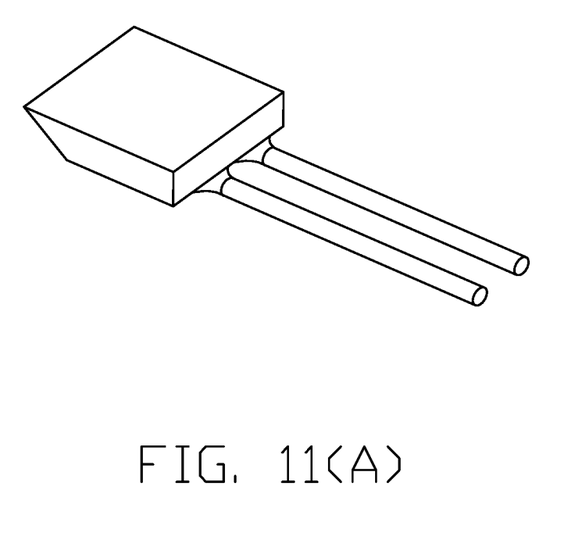
FIG. 11(A) shows the temperature sensor applicable to the invention.
Figure 11B:
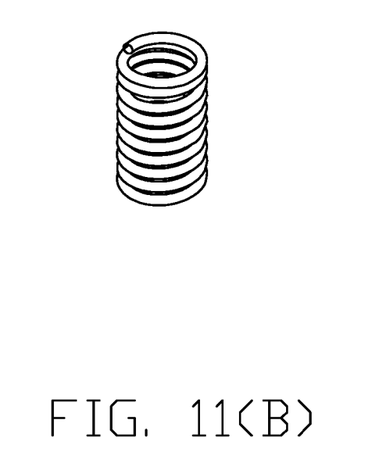
FIG. 11(B) shows the coil spring applicable to the invention.

The heat sink 12 includes a main body 121 received within the opening 115, and a pair of side extensions 122 extending from two sides of the main body 121 and seated upon the left wall 113 and the right wall 114, respectively. As shown in FIG. 11, the main body 121 includes a receiving hole 1212 in the front face 1211 for receiving a temperature sensor or resistance temperature detector (RTD) (not shown) for assuring the precise temperature of the heat sink not to damage the CPU 2000. The main body 121 forms an installation hole 1214 located in the upper surface 1213 and communicating with the receiving hole 1212 so as to have the aforementioned RTD installed in the main body 121 with the corresponding wires extending through the receiving hole 1212 and the corresponding slot 117 for linking to the PCB on which the electrical connector assembly 1000 is mounted. The side extension 122 forms a plurality of spring grooves 1221 receiving corresponding coil springs (not shown) therein, and a notch 1222 extending therethrough in the vertical direction.

The pressing block 13 includes a plurality of spring holes 131 so as to cooperate with the corresponding spring grooves 1221 to hold the corresponding typical coil springs (not shown) therein, thus providing resilient arrangement between the pressing block 13 and the side extension 122. The pressing block 13 further includes a plurality of securing holes 133, and the corresponding screws (not shown) extend through both the securing holes 133 and the corresponding securing holes 116 of the first frame 11 to assemble the first cover 1 together with the heat sink 12 therebetween in a floating/resilient manner along the vertical direction. Notably, the pressing block 13 further includes a downward projection 132 to be received within the corresponding notch 1222 so as to assure the relative movement of the heat sink 12 in the exact vertical direction.

The second cover 2 includes a second frame 21, a metallic top 22 having a rear end pivotally secured to a rear end of the second frame 21, and a rotatable latch 23 pivotally secured to a front end of the metallic top 22 via a second pivot 24. The second frame 21 includes a front section 211 confronting the first wall 111 of the first frame 11, a rear section 212 confronting the rear wall 112 of the first frame 11, a left section 213 confronting the left wall 113 of the first frame 11 and a right section 214 confronting the right wall 114 of the first frame 11. Therefore, the space 215 formed among the front section 211, the rear section 212, the left section 213 and the right section 214 is to essentially receive the first cover 1 therein. The front section 211 includes a pair of retaining blocks 2111 with a space 2112 therebetween to receive the latch 23 therein. The pivot holes 209 are formed in the corresponding retaining blocks 2111. The latch 23 includes a pair of hooks 231 to be received within the corresponding recesses 108 of the seat unit 100 when the cover unit is secured to the seat unit 100. The metallic top 22 includes a left portion 221, a right portion 222 and a retaining portion 223 linked therebetween at the front end so as to compliantly cover the second frame 21. The latch 23 includes a pivot hole 233 so as to have the second pivot 24 extend through the hole 229 of the retaining portion 223 of the metallic top 22 and the pivot hole 233 to assemble the latch 23 upon the metallic top 22. The latch 23 includes an operation area 232 so as to allow the user to rotate the latch 23 for disengaging the hook 231 of the latch 23 from the recess 108 for releasing the cover unit 200 from the seat unit 100. Understandably, the pivotal latch 23 is unable to be incautiously outwardly rotated for releasing the cover unit 200 from the seat unit 100 because of the retaining portion 223. Differently, when the latch 23 is intentionally rotated, the retaining portion 223 may be outwardly deflected to allow outward rotation of the latch 23 for disengaging the hook 231 from the corresponding recess 108 in the seat unit 100. Notably, the retaining portion 223 forms a notch 224 to receive the operation area 232 therein for easy operation consideration. Notably, the first frame 11 is assembled to the second frame 21 via the four screws/pins (not labeled) extending through the corresponding holes (not labeled) in the first frame 11 and those in the second frame 21

The operation/assembling of the electrical connector assembly 1000 is similar to what is disclosed in the aforementioned U.S. Pat. No. 9,395,409. When assembled, the hook 231 of the metallic top 22 of the second cover 2 of the cover unit 200 is received within the recess 108 of the seat unit 100, and the hook 228 of the metallic top 22 of the second cover 2 of the cover unit 200 is engaged with the locking wheel 107 of the seat unit 100. The heat sink 12 is retained between the pressing blocks 13 and the first frame 11 along the vertical direction in a floating and resilient manner due to the coil spring located between the pressing block 13 and the side extension 122 of the heat sink 12. Also, the heat sink is equipped with a temperature sensor which is embedded within the main body 121 of the heat sink 12 and communicates with the PCB via the slot 117 formed in the first frame 11.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly comprising:
   a seat unit forming a receiving cavity for receiving an electronic package; and
   a cover unit positioned upon the seat unit and including:
   a first cover including a lower first frame and an upper pressing block secured to each other to commonly sandwich a heat sink therebetween along a vertical direction in a floating manner; wherein
   the heat sink is located above the receiving cavity in the vertical direction; and
   a spring mechanism is provided between the pressing block and the heat sink to constantly urge the heat sink toward the first frame downwardly in the vertical direction.

2. The electrical connector assembly as claimed in claim 1, wherein the cover unit further includes a second cover having a second frame and a metallic top pivotally assembled with each other, and the first frame is assembled to the second frame.

3. The electrical connector assembly as claimed in claim 2, wherein a front end region of the second frame of the second cover of the cover unit is permanently pivotally secured to a front end region of the seat unit.

4. The electrical connector assembly as claimed in claim 3, wherein a rotatable latch is pivotally assembled to the metallic top around the front end region of the second frame and equipped with a hook releasably engaged within a corresponding recess of the seat unit to secure the metallic top of the cover unit and the seat unit together.

5. The electrical connector assembly as claimed in claim 4, wherein the metallic top further includes a hook around a rear end region of the second frame to reliably engage a corresponding locking wheel on the seat unit.

6. The electrical connector assembly as claimed in claim 4, wherein the metallic top includes a retaining portion at a front end in front of the pivotal latch so as to rearwardly confront the pivotal latch for avoiding incautious rotation of the pivotal patch.

7. The electrical connector assembly as claimed in claim 2, wherein the first cover is surrounded by the second frame.

8. The electrical connector assembly as claimed in claim 1, wherein the heat sink is built with a temperature sensor therein.

9. The electrical connector assembly as claimed in claim 8, wherein the heat sink forms a receiving hole to receive the temperature sensor therein, and the first frame forms a slot to have the temperature sensor communicate with an exterior.

10. The electrical connector assembly as claimed in claim 1, wherein the pressing block forms a downward projection to be received within a notch formed in the heat sink.

11. The electrical connector assembly as claimed in claim 1, wherein the heat sink has a downward projecting main body received within a space formed in the first frame.

12. The electrical connector assembly as claimed in claim 11, wherein the main body forms an upper face with a vertical hole to communicate with a receiving hole which receives a temperature sensor and extends in a horizontal direction to communicate with an exterior.

13. An electrical connector assembly comprising:
a seat unit forming a receiving cavity for receiving an electronic package; and
a cover unit positioned upon the seat unit and including:
a first cover including a lower first frame and an upper pressing block secured to each other to commonly sandwich a heat sink therebetween along a vertical direction in a floating manner; wherein
the heat sink is located above the receiving cavity in a vertical direction;
the heat sink forms a receiving hole to receive a temperature sensor therein.

14. The electrical connector assembly as claimed in claim 13, wherein the receiving hole extends in a horizontal direction to communicate with an exterior.

15. The electrical connector assembly as claimed in claim 14, wherein the first frame forms a horizontal slot to have the receiving hole communicate with the exterior.

16. The electrical connector assembly as claimed in claim 15, wherein the heat sink forms a vertical hole in an upper face to communicate with the receiving hole.

17. An electrical connector assembly comprising:
a seat unit forming a receiving cavity for receiving an electronic package; and
a cover unit positioned upon the seat unit and including:
a first cover including a lower first frame and an upper pressing block secured to each other to commonly sandwich a heat sink therebetween along a vertical direction in a floating manner; and
a second cover including a lower second frame assembled with the first frame, a metallic top pivotally assembled to the second frame, and a rotatable latch pivotally secured to the metallic top with a hook adapted to be engaged within a recess in the seat unit; wherein
the heat sink is located above the receiving cavity in the vertical direction; and
the metallic top includes a retaining portion in front of the rotatable latch to rearwardly confront the rotatable latch for preventing incautious outward rotation of the rotatable latch.

18. The electrical connector assembly as claimed in claim 17, wherein the rotatable latch includes an operation area, and the retaining portion forms a notch receiving said operation area.

19. The electrical connector assembly as claimed in claim 18, wherein the second frame is permanently pivotally secured to the seat unit while both the rotatable latch and the metallic top are releasably latched to the seat unit.

* * * * *